(12) United States Patent
Jung et al.

(10) Patent No.: US 7,791,268 B2
(45) Date of Patent: Sep. 7, 2010

(54) DISPLAY DEVICE USING REFLECTIVE FILM AND MANUFACTURING METHOD OF THE SAME

(75) Inventors: Jae-hoon Jung, Suwon-si (KR); Nam-deog Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 254 days.

(21) Appl. No.: 11/839,188

(22) Filed: Aug. 15, 2007

(65) Prior Publication Data

US 2007/0278942 A1 Dec. 6, 2007

Related U.S. Application Data

(63) Continuation of application No. 11/556,545, filed on Nov. 3, 2006, now Pat. No. 7,288,886.

(30) Foreign Application Priority Data

Nov. 7, 2005 (KR) .......................... 2005-0106075

(51) Int. Cl.
*H05B 33/14* (2006.01)
(52) U.S. Cl. ...................... 313/504; 313/506; 313/509; 445/23

(58) Field of Classification Search ................. 313/504, 313/506, 509, 512; 445/23–25
See application file for complete search history.

(56) References Cited

U.S. PATENT DOCUMENTS

| 5,834,893 | A | 11/1998 | Bulovic et al. |
| 6,091,195 | A | 7/2000 | Forrest et al. |
| 2004/0113550 | A1 | 6/2004 | Adachi et al. |

FOREIGN PATENT DOCUMENTS

| CN | 1607879 | 4/2005 |
| JP | 2003-100464 | 4/2003 |

OTHER PUBLICATIONS

Korean Office Action for Patent Application: 10-2005-0106075 and English Translation; Date of Mailing: Mar. 23, 2007. All references cited in the Office action are listed above.

*Primary Examiner*—Joseph L Williams
(74) *Attorney, Agent, or Firm*—Cantor Colburn LLP (57) ABSTRACT

A display device includes; a thin film transistor formed on a insulating substrate, a pixel electrode electrically connected to the thin film transistor, an organic layer formed on the pixel electrode, a wall surrounding the organic layer, a reflective film formed on the wall, and a common electrode formed on the organic layer.

22 Claims, 13 Drawing Sheets

DISPLAY DEVICE USING REFLECTIVE FILM AND MANUFACTURING METHOD OF THE SAME

CROSS-REFERENCE TO RELATED APPLICATIONS

This application is a continuation application of U.S. application Ser. No. 11/556,545 filed on Nov. 3, 2006, which claims priority to Korean Patent Application No. 2005-0106075, filed on Nov. 7, 2005, and all the benefits accruing therefrom under 35 U.S.C. §119, the contents of which in its entirety are herein incorporated by reference.

This application claims priority to Korean Patent Application No. 2005-0106075, filed on Nov. 7, 2005, and all the benefits accruing therefrom under 35 U.S.C. §119, the contents of which in its entirety are herein incorporated by reference.

BACKGROUND OF INVENTION (a) Field of Invention

The present invention relates to a display device, and more particularly, to a display device in which a reflective film is formed on walls of the display, thus improving optical efficiency.

(b) Description of the Related Art

An organic light emitting diode ("OLED") display has recently been gaining popularity among flat panel displays because of its low driving voltage, light and thin construction, wide viewing angle, and high-speed response. The OLED display is classified into a passive matrix type and an active matrix type depending on the driving method used therefor.

The active matrix type OLED display, in which thin film transistors ("TFTs") are connected to each pixel region, controls the light emission of organic light-emitting layer on the basis of each pixel region. Pixel electrodes, each of which is electrically separated from adjacent other pixel electrodes to allow for independent control of each pixel, are located in each pixel region. In addition, walls, which are constructed on a substrate to be taller than the pixel electrodes, are formed between the pixel regions and serve to prevent a short-circuit between the pixel electrodes and to insulate between the pixel regions. A hole injection layer and an organic light-emitting layer may be sequentially formed on the pixel electrode between the walls. A common electrode is formed on the organic light-emitting layer.

Another way in which OLED displays may be differentiated is the orientation in which they emit light. There are two basic orientations; top-emission type and bottom-emission type. The top-emission type display emits light from the organic light-emitting layer through a common electrode to an outside. The bottom-emission type display emits light from the organic light-emitting layer through a substrate to an outside.

However, the OLED display has low external quantum efficiency, sometimes less than 20%, regardless of the light emission type. Also, the OLED has low optical efficiency since a portion of the light emitted by the light-emitting layer is emitted to the sides of the display and dissipated therefrom instead of being directed to the outside.

BRIEF SUMMARY OF THE INVENTION

An aspect of the present invention is to provide a display device with increased optical efficiency.

Another aspect of the present invention is to provide a manufacturing method of a display device with higher optical efficiency.

The foregoing and/or other aspects of the present invention can be achieved by providing an exemplary embodiment of a display device including; a thin film transistor formed on an insulating substrate, a pixel electrode electrically connected to the thin film transistor, an organic layer formed on the pixel electrode, a wall surrounding the organic layer, a reflective film formed on the wall, and a common electrode formed on the organic layer.

According to an exemplary embodiment of the present invention, the reflective film comprises any one selected from a group consisting of Mo, Cr, Ag and Al.

According to an exemplary embodiment of the present invention, the thickness of the reflective film is about 50 nm to about 500 nm.

According to an exemplary embodiment of the present invention, reflectivity of the reflective film is greater than about 70%.

According to an exemplary embodiment of the present invention, an angle between the side surface of the wall and the insulating substrate is about 40 degrees to about 50 degrees.

According to an exemplary embodiment of the present invention, at least part of the wall is made of a photosensitive organic material.

According to an exemplary embodiment of the present invention, the reflective film and the pixel electrode are spaced apart from each other.

According to an exemplary embodiment of the present invention, the reflective film and the organic layer are spaced apart from each other.

According to an exemplary embodiment of the present invention, the wall and the pixel electrode are spaced apart from each other.

According to an exemplary embodiment of the present invention, the wall and the organic layer are spaced apart from each other, and the organic layer comprises a low molecular weight material and is formed by an evaporation method.

According to an exemplary embodiment of the present invention, the wall and the organic layer are in contact with each other, the organic layer comprises polymer material and is formed by an ink jet method.

According to an exemplary embodiment of the present invention, the wall covers a part of the pixel electrode, and the reflective film is spaced apart from the pixel electrode.

According to an aspect of the present invention, light transmittance of the common electrode is greater than about 50%.

The foregoing and/or other aspects of the present invention can be achieved by providing an exemplary embodiment of a method of manufacturing a display device, including; forming a thin film transistor on an insulating substrate, forming a pixel electrode electrically connected to the thin film transistor, forming a wall surrounding the pixel electrode, forming a reflective film on the wall, forming an organic layer on the pixel electrode, and forming a common electrode on the organic layer.

According to an exemplary embodiment of the present invention, the wall is formed with its side surface and the insulating substrate making an angle of about 40 degrees to about 50 degrees.

According to an exemplary embodiment of the present invention, the wall is formed to be spaced apart from the pixel electrode.

According to an exemplary embodiment of the present invention, the forming of the wall comprises coating a positive photosensitive material on the organic layer, and exposing and developing the positive photosensitive material.

According to an exemplary embodiment of the present invention, the forming of the wall includes coating a negative photosensitive material on the organic layer, and exposing and developing the negative photosensitive material.

According to an exemplary embodiment of the present invention, the forming of the wall includes; coating a photosensitive material on the organic layer, exposing the photosensitive material using a mask having a slit pattern formed to correspond to a side surface of the wall, and developing the exposed photosensitive material.

According to an exemplary embodiment of the present invention, the forming of the wall includes; coating a photosensitive material on the organic layer, and pressing an imprint mask formed with an intaglio pattern corresponding to the wall against the photosensitive material.

According to an exemplary embodiment of the present invention, the forming of the organic layer includes; arranging a shadow mask having an opening wider than a region surrounded by the wall where the opening corresponds to the pixel electrode, and supplying organic material vapor through the opening.

BRIEF DESCRIPTION OF THE DRAWINGS

The above and/or other aspects, features and advantages of the present invention will become apparent and more readily appreciated from the following description of the exemplary embodiments, taken in conjunction with the accompany drawings, in which.

DETAILED DESCRIPTION OF THE INVENTION

The invention will now be described more fully hereinafter with reference to the accompanying drawings, in which exemplary embodiments of the present invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 1:
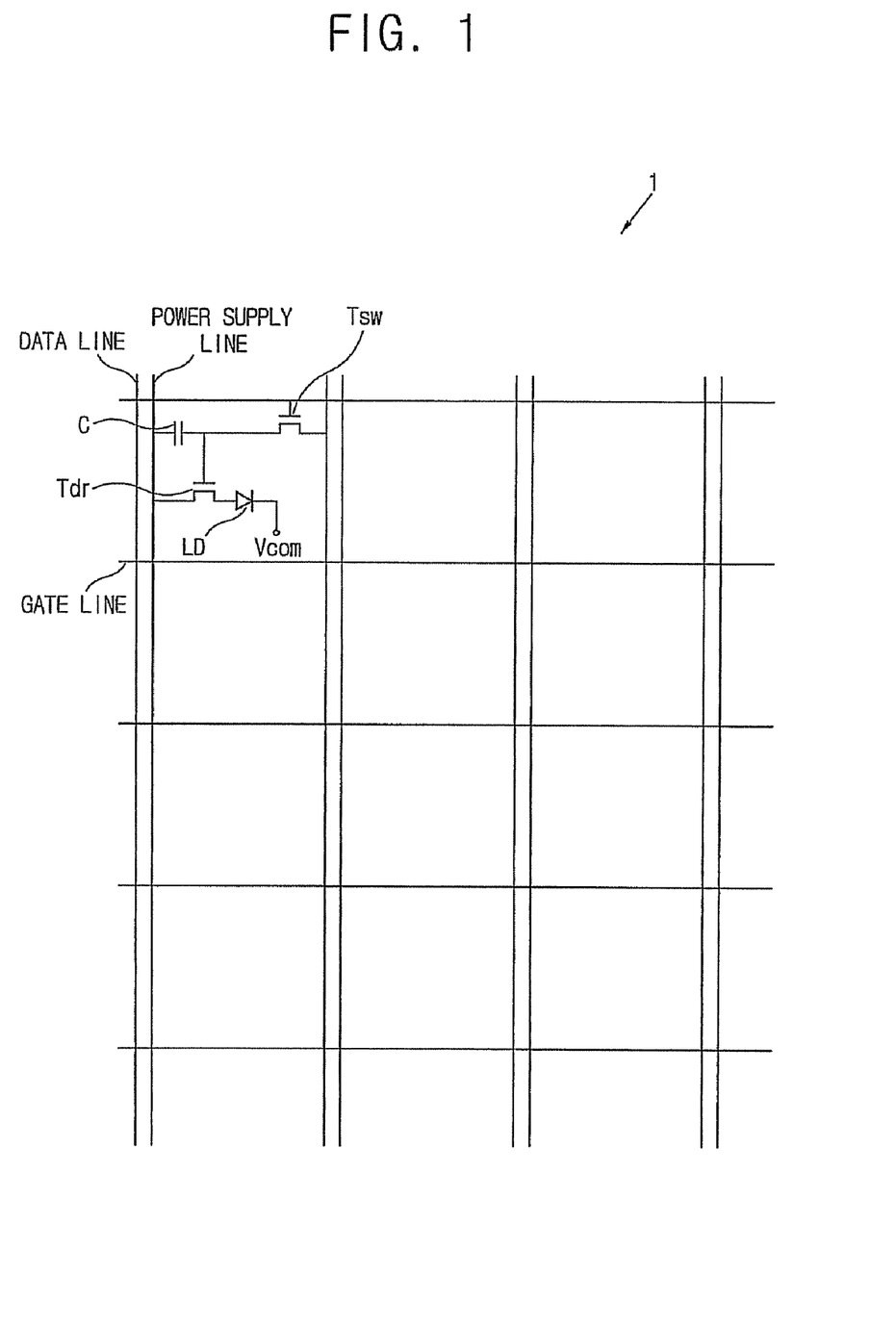
FIG. 1 is an equivalent circuit diagram of a first exemplary embodiment of a display device according to the present invention.

FIG. 1 is an equivalent circuit diagram of a first exemplary embodiment of a display device according to the present invention.

Referring to FIG. 1, a display device 1 according to the present exemplary embodiment includes a plurality of signal lines.

The signal lines include gate lines for transmitting scan signals, data lines for transmitting data signals, and power supply lines for transmitting drive voltages. The data lines and power supply lines are arranged adjacently and substantially in parallel to each other, and the gate lines extend substantially perpendicular to the data line and the power supply line.

Each pixel includes an organic light-emitting element (LD), a switching transistor Tsw, a drive transistor Tdr, and a capacitor C.

The drive transistor Tdr has a control terminal connected to the switching transistor Tsw and one side of the capacitor C, an input terminal connected to the power supply line, and an output terminal connected to the organic light-emitting element LD.

The organic light-emitting element LD has an anode connected to the output terminal of the drive transistor Tdr and a cathode connected to the common voltage Vcom. The organic light-emitting element LD emits light with different intensity depending on the output current of drive transistor Tdr. The magnitude of the current outputted by the drive transistor Tdr varies depending on the voltage applied between the control terminal and the output terminal. A plurality of LDs may work together to display an image.

The switching transistor Tsw has a control terminal connected to the gate line, an input terminal connected to the data line and an output terminal connected to the control terminal of the drive transistor Tdr and one side of the capacitor C. The switching transistor Tsw transmits the data signal applied to the data line to the drive transistor Tdr according to the scan signal applied to the gate line.

The capacitor C is connected between the control terminal and the input terminal of the drive transistor Tdr along the power supply line. The capacitor C is charged with and maintains the data signal inputted to the control terminal of the drive transistor Tdr.

Figure 2:
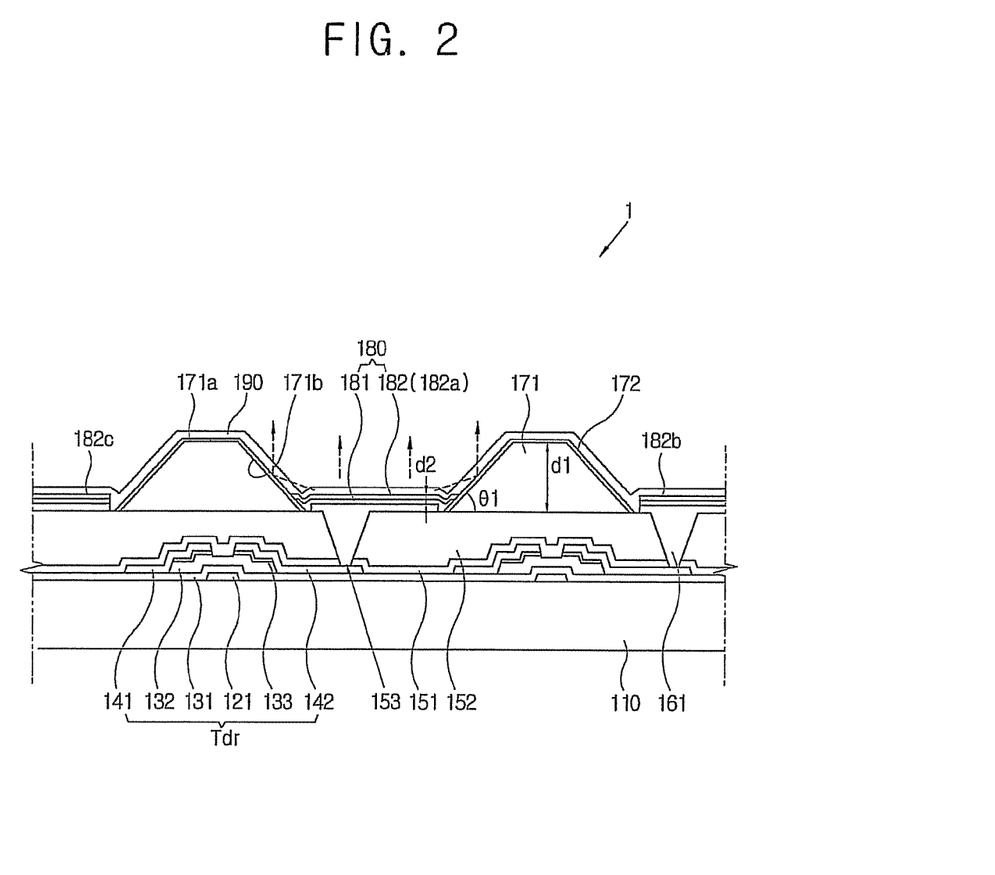
FIG. 2 is a cross-section diagram of the first exemplary embodiment of a display device according to the present invention.

The display device 1 according to the first exemplary embodiment will be described below in more detailed with reference to FIG. 2. FIG. 2 shows the drive transistor Tdr.

A gate electrode 121 is formed on an insulating substrate 110 made of an electrically insulating material such as glass, quartz, plastic, or other similar substances.

A gate insulating film 131 is formed on the insulating substrate 110 and the gate electrode 121. In one exemplary embodiment, the gate insulating film is made of silicon nitride (SiNx) or other similar substances.

A semiconductor layer 132 made of amorphous silicon and an ohmic contact layer 133 made of n+ hydrogenated amorphous silicon doped with high density of n type impurities are sequentially formed on the gate insulating film 131, above the gate electrode 121. The ohmic contact layer 133 is separated into two parts with respect to the gate electrode 121; one part above and to the left and one part above and to the right.

A source electrode 141 and a drain electrode 142 are formed on the ohmic contact layer 133, the gate insulating film 131, and the sides of the semiconductor layer 132. The source electrode 141 and the drain electrode 142 are separated away from each other with respect to the gate electrode 121.

A passivation film 151 is formed on the source electrode 141, the drain electrode 142 and portion of the semiconductor layer 132 left uncovered by the source and gate electrodes 141 and 142. In one exemplary embodiment the passivation film 151 may comprise silicon nitride ("SiNx") An organic film 152 is formed on the passivation film 151. In one exemplary embodiment the organic film 152 may comprise any one of benzocyclobutene ("BCB") series, olefin series, acrylic resin series, polyimide series, and fluoropolymer such as polytetrafluoroethylene (PTFE), perfluorocyclobutane (PFCB), fluorinated ethylene propylene (FEP), poly fluoro alkoxy (PFA), ethylene tetra fluoro ethylene (ETFE) and polyvinylidene fluoride (PVDF). The fluoropoymer may have structural formula 1 which is known as cytop(trademark) produced by Asahi Glass, Japan.

Structural Formula 1:

The passivation film 151 and the organic film 152 are partially removed from the top side of drain electrode 142 to form a contact hole 153.

A pixel electrode 161 is formed on the organic film 152. The pixel electrode 161, which is also referred to as an anode, supplies holes to the organic layer 180. When the OLED display is a bottom-emission type display, the pixel electrode 161, comprises a transparent conductive material, exemplary embodiments of which include indium tin oxide ("ITO") or indium zinc oxide ("IZO"), is connected to the drain electrode 142 through the contact hole 153. On the other hand, when the display is a top-emission type display, the pixel electrode 161 may comprise highly reflective metals.

A wall 171 surrounding the pixel electrode 161 is formed on the pixel electrode 161 and the organic film 152. The wall 171, having a relatively flat upper surface 171a and an inclined side surface 171b, is spaced apart from and not in contact with the pixel electrode 161.

The wall 171 may comprise a photosensitive material, exemplary embodiments of which include acryl resin and polyimide resin with thermal resistance and solvent resistance or an inorganic material such as SiO2, TiO2, or other similar substances. Alternative exemplary embodiments include configurations where the wall 171 may have a two-layer structure of an organic layer and an inorganic layer. An angle θ1 between the side surface of wall 171 and the insulating substrate 110 may be about 40 degrees to about 50 degrees. In one exemplary embodiment the angle θ1 is about 45 degrees. According to one exemplary embodiment, the thickness d1 of the wall 171 is about 3 μm to about 5 μm.

On the wall 171 is formed a reflective film 172. The reflective film 172 is formed only on the wall 171, and is spaced apart from the pixel electrode 161. Exemplary embodiments of the reflective film 172 may comprise Mo, Cr, Ag, or Al, and the film's reflectivity is above about 70%. In one exemplary embodiment the film's reflectivity is from about 70% to about 95%.

The thickness of the reflective film 172 is from about 50 nm to about 500 nm. If the thickness is less than about 50 nm, reflection efficiency is decreased. On the other hand, reflection efficiency is maximized at about 500 nm and increases in thickness past this point only result in increased formation time without further increases in efficiency.

An organic layer 180 is formed on the pixel electrode 161. The organic layer 180, comprising a low molecular weight material, comprises a hole injection layer 181 and a light emitting layer 182. The light emitting layer 182 may comprise any of a plurality of sub layers 182a, 182b, 182c, each emitting a different color of light. The organic layer 180 is formed to prevent the pixel electrode 161 and the common electrode 190 being contact each other.

Alternative exemplary embodiments include the configuration wherein each light emitting layer comprises three sub layers each emitting light of a different primary color, red, green or blue. Then, after the formation of the common electrode, as discussed below, one of a plurality of additional color filters may be applied so that each pixel emits one of a red, green or blue light.

The organic layer 180 may further comprise a hole transfer layer (not shown), an electron transfer layer (not shown) and an electron injection layer (not shown). The thickness d2 of the organic layer 180 is 0.1 μm to 0.3 μm.

The hole transmitted from the pixel electrode 161 and the electron transmitted from the common electrode 190 are combined with each other in the light emitting layer 182 to form an exciton. When the exciton de-excites, e.g., when the electron falls from a higher energy state to a lower energy state, a photon is emitted.

The common electrode 190 is disposed on the top side of the wall 171 and the light emitting layer 182. The common electrode 190, also referred to as a cathode, supplies electrons to the light emitting layer 182. The common electrode 190, exemplary embodiments of which may be made of an alloy of Mg and Ag or an alloy of Ca and Ag, may be about 50 nm to about 200 nm in thickness. If the thickness of the common electrode 190 is below about 50 nm, its resistance is excessively increased so that a common voltage may not be applied smoothly. On the other hand, if it is above about 200 nm, the common electrode 190 may become opaque. In one exemplary embodiment the optical transmittance of the common electrode 190 is greater than 50%.

In the present exemplary embodiment light emitted from the light emitting layer 182 radiates to the outside via the common electrode 190. A portion of the light emitted from the light emitting layer 182 is radiated in the direction of wall 171 and is reflected by the reflective film 172 to the outside. Therefore, light which would otherwise have been absorbed by the wall 171 or randomly scattered is directed to the outside. Thus, light emitting efficiency is improved.

According to the present exemplary embodiment an angle θ1 between the side surface 171b of the wall 171 and the insulating substrate 110 may be about 40 degrees to about 50 degrees, and the light reflected by the reflective film 172 progresses in a direction perpendicular to the insulating substrate 110, and thus light emitting efficiency is further improved.

An additional passivation film (not shown), a moisture absorption film, or other similar layers may be formed on the top side of the common electrode 190 in the display device 1. Also, the display device 1 may further comprise an encapsulation member (not shown), exemplary embodiments of which are made of glass or other similar substances.

An exemplary embodiment of a method of manufacturing a display device according to the first exemplary embodiment will be described below with reference to FIGS. 3A to 3F.

Figure 3A:
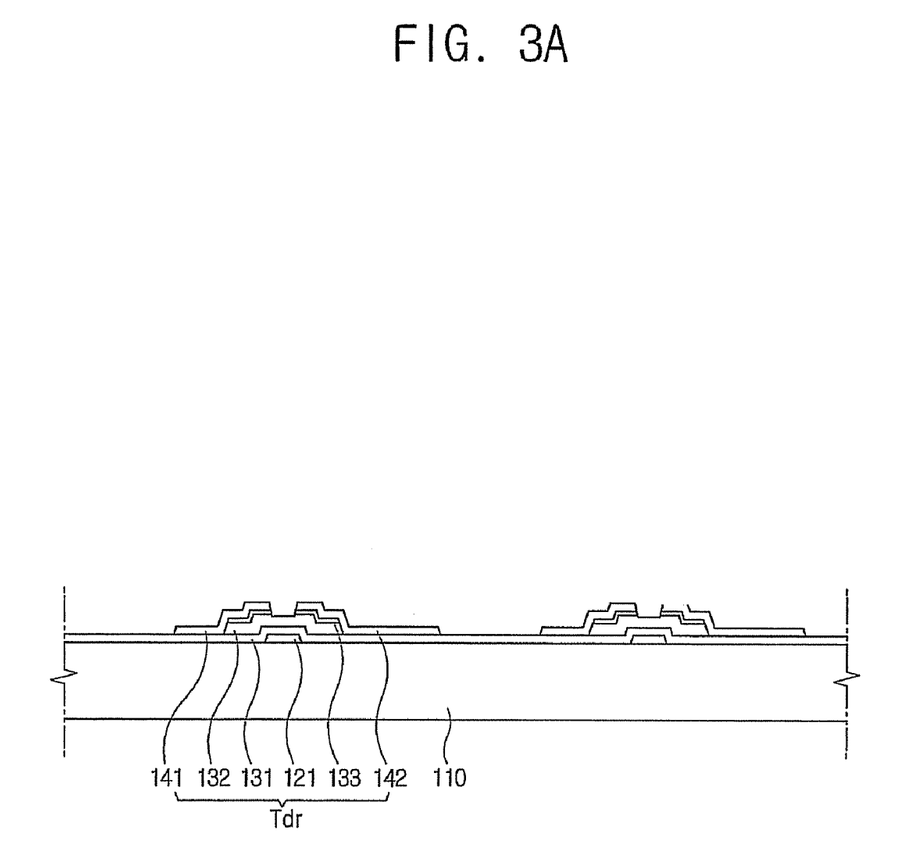
FIGS. 3a through 3f are cross-section diagrams illustrating an exemplary embodiment of a method of manufacturing a first exemplary embodiment of a display device according to the present invention.

Firstly, a thin film transistor Tdr is formed on the insulating substrate 110 as shown in FIG. 3A. The thin film transistor Tdr, whose the channel part is made of amorphous silicon, may be manufactured by any of several known methods, e.g., chemical vapor deposition ("CVD"), photolithographic processes, or other similar methods.

Figure 3B:
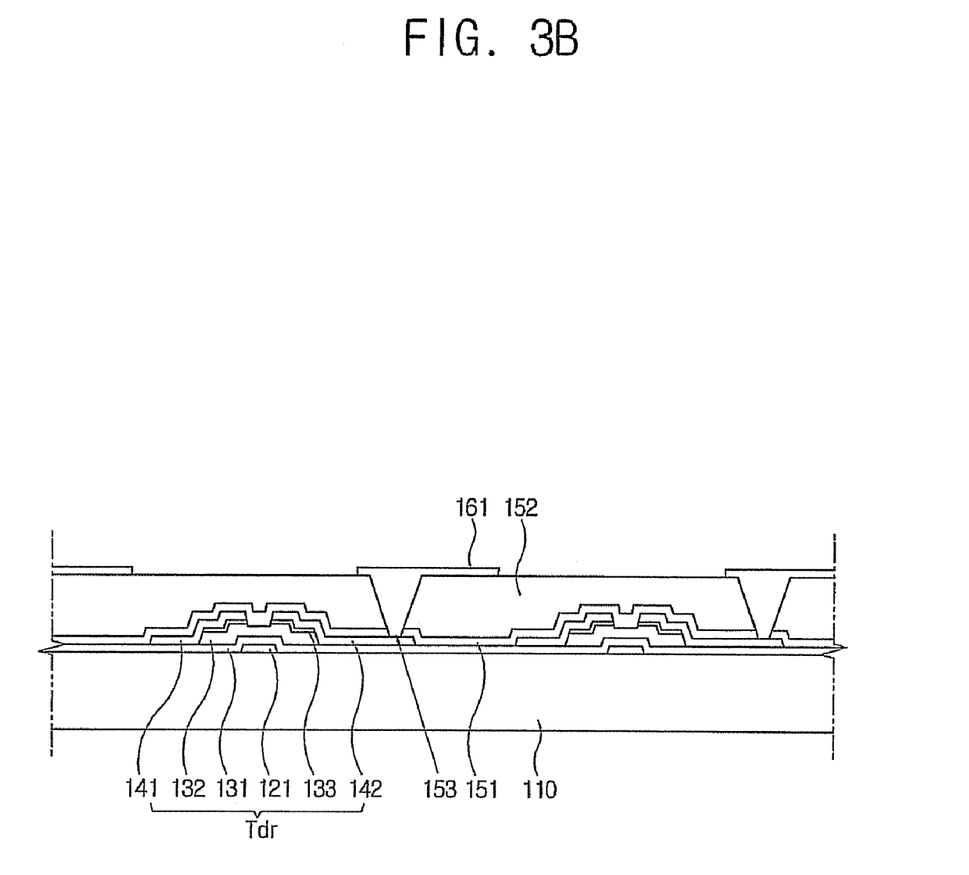

Next, as shown in FIG. 3B, a passivation film 151, an organic film 152, and a pixel electrode 161 are formed on the thin film transistor Tdr. In the exemplary embodiment where the passivation film 151 is made of silicon nitride, a chemical vapor deposition method may be employed. The organic film 152 may be formed by slit coating or spin coating, and a contact hole 153 may be formed by exposing and developing. The pixel electrode 161 may be formed by photo etching, after a transparent conductive layer has been formed by sputtering. On the other hand, in a top-emission type display the pixel electrode 161 is not required to be transparent, and thus the pixel electrode 161 may be made of reflective metals.

Figure 3C:
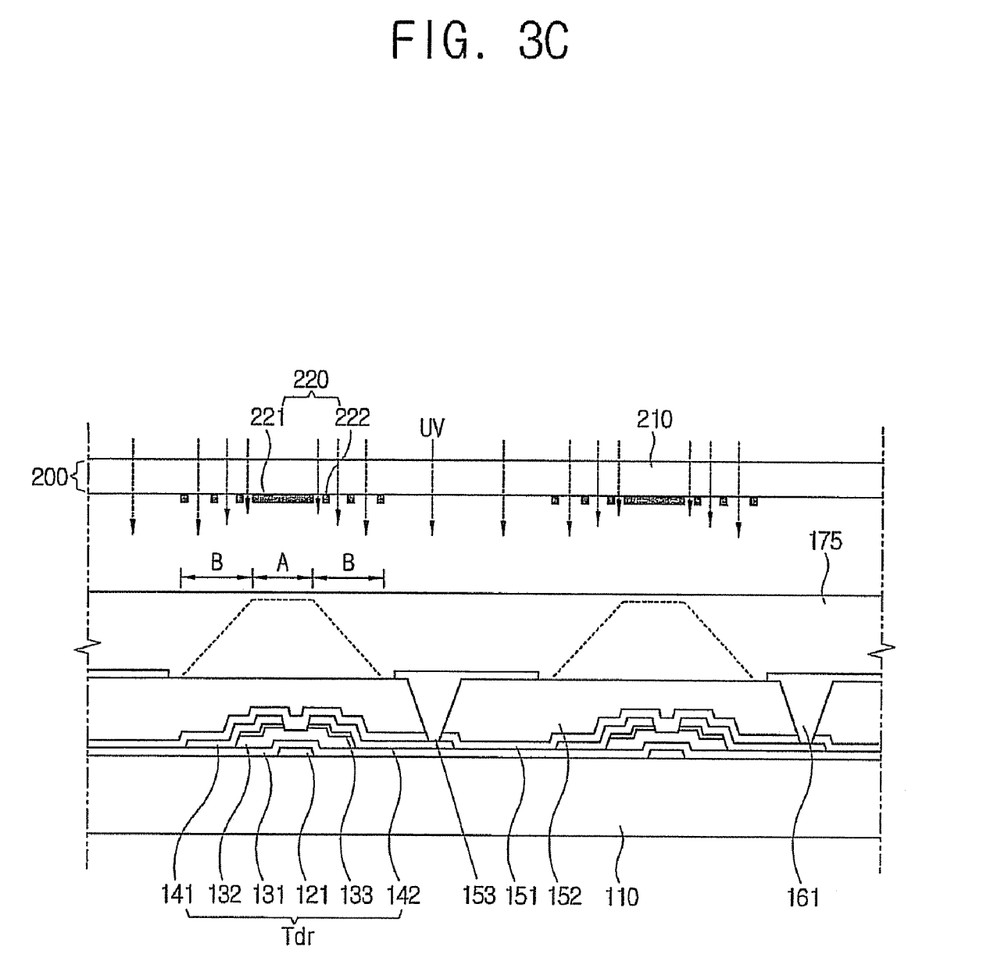

Then, a photosensitive material layer 175 is formed and exposed using a mask 200 as shown in FIG. 3C. According to the present exemplary embodiment, the photosensitive material layer 175 is as a positive type photoresist formed by slit coating or spin coating in which its exposed part is dissolved. Although not shown, alternative exemplary embodiments include configurations where the photosensitive material layer 175 may be a negative type photoresist in which the exposed portion remains after exposing and developing processes.

The mask 200 comprises a base substrate 210 made of quartz and the like and a light blocking layer 220 formed on the base substrate 210. The light blocking layer 220, which prevents ultra violet light from being transmitted therethrough. In one exemplary embodiment the light blocking layer 220 may be made of chrome oxide.

The light blocking layer 220 comprises a central pattern 221 provided in the position A where the upper surface of wall 171 is to be positioned, and slit patterns 222 located to either side of the central pattern. The farther the slit pattern 222 is distant from the central pattern 221, the wider is the interval between the slit patterns. The slit pattern 222 corresponds to the position B where the side surface 171b of wall 171 is to be formed.

In the present exemplary embodiment the photosensitive material layer 175 under the central pattern 221 is not dissolved during the exposing process since it is not exposed to ultra violet light. On the other hand, the photosensitive material layer 175 under the slit pattern 222 is dissolved to a greater extent the further it is from the central pattern 221 since the exposure to ultra violet light increases with distance from the central pattern 221.

During the developing process after the exposing process, a part of the photosensitive material layer 175 in the region B corresponding to the slit pattern 222 is dissolved to a greater extent the further it is from the center of the layer 175. Finally the side surface 171b as shown in FIG. 2 is formed. After the developing process, a curing process at a temperature of 200° C. to 300° C. completes a wall 171.

Alternatively, it is possible to a side surface making an acute angle between the side surface and the insulating substrate 110 using a positive type photosensitive layer 175 and a mask without slit patterns (not shown). In such an exemplary embodiment the side surfaces are formed through the diffraction of light around the central pattern 221.

Figure 3D:
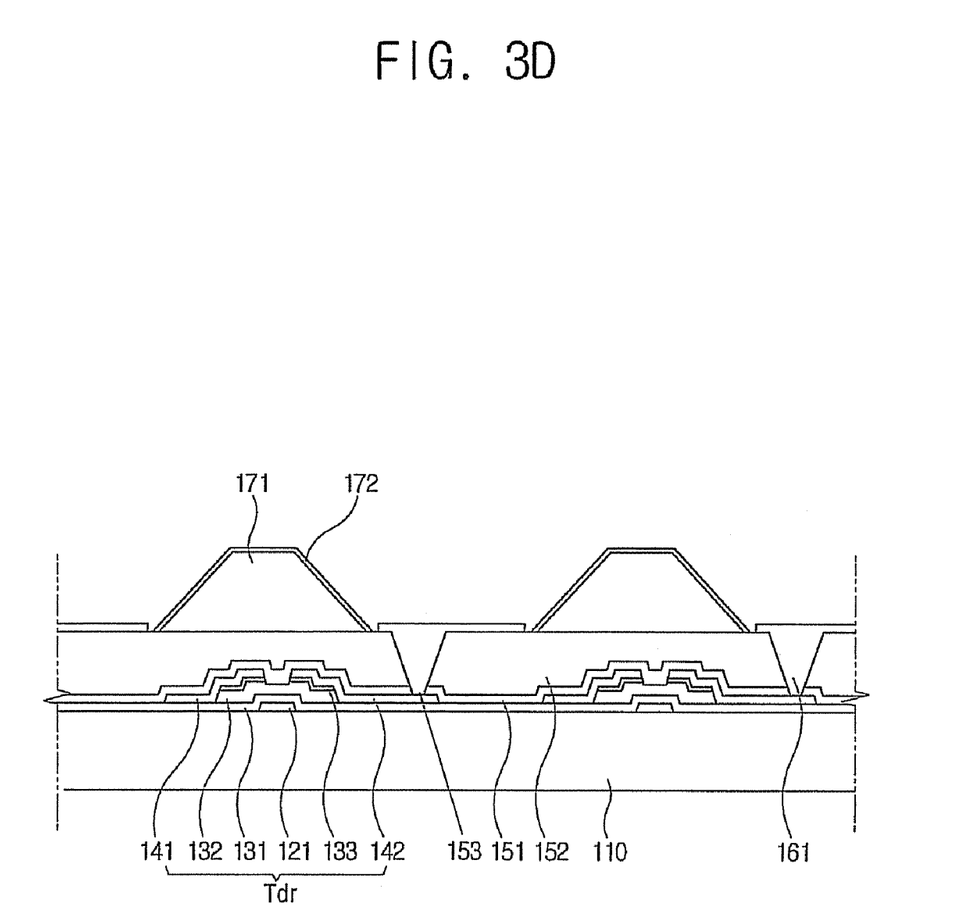

FIG. 3D shows a reflective film 172 is formed on the completed wall 171. To form the reflective film 172 a metal layer is deposited on the top surface of the wall 171 and then a photo etching process removes excess material. Alternatively, a deposition method including sputtering, e-beam evaporation, thermal evaporation, or other similar techniques, may be used. According to the present exemplary embodiment, the reflective film 172 is located only on the wall 171.

Figure 3E:
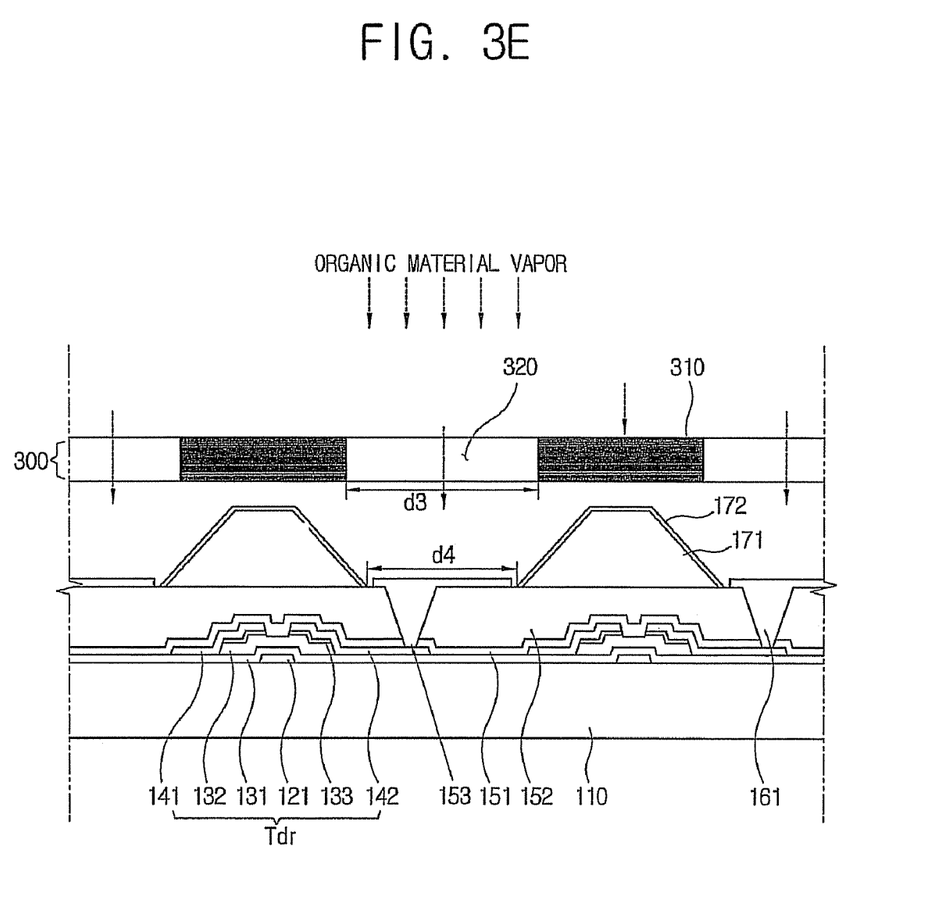

Then, organic material vapor is supplied on the pixel electrode 161 using a shadow mask 300 as shown in FIG. 3E.

The shadow mask 300 comprises a blocking part 310 which does not transmit the organic material vapor and an opening 320 corresponding to the pixel electrode 161. The width d3 of the opening 320 is provided to be bigger than a distance d4 between walls 171. This makes the organic layer 180 to cover the pixel electrode 161. In this arrangement, if the organic material vapor is supplied through the opening 320, it is made to contact the pixel electrode 161 corresponding to the opening 320 and the organic material's phase changes to a solid state, and thus an organic layer 180 is formed.

Figure 3F:
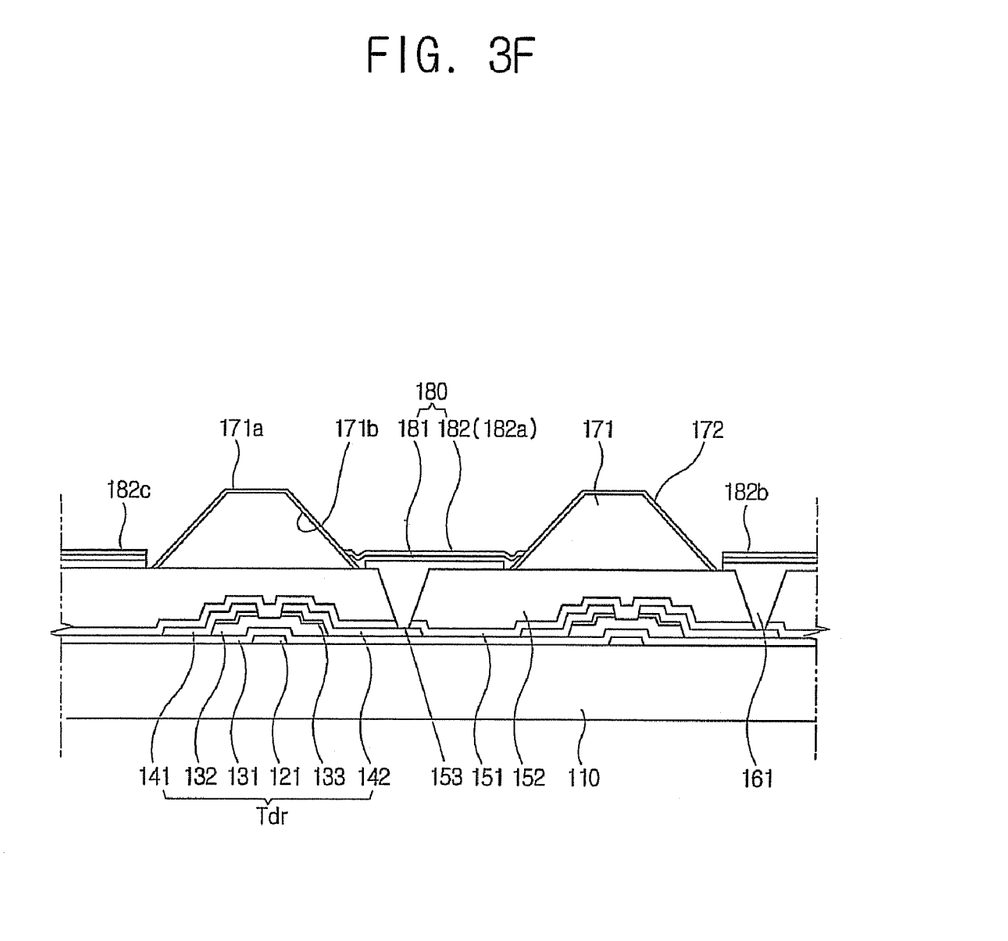

FIG. 3F shows the fully formed organic layer 180. Various sub-layers of the organic layer 180, such as the hole injection layer 181, are formed using the shadow mask 300 shown in FIG. 3E. The light emitting layer 182 comprising one of a plurality of sub layers 182a, 182b, 183c is formed using a separate shadow mask with different formation patterns for each of the sub layers so that only one sub layer is present in the organic layer 180 of an individual pixel.

Alternative exemplary embodiments (not shown) may include the configuration where all three sub layers 182a, 182b and 182c are present in the organic layer 180 of each individual pixel. In such an embodiment a color filter (not shown) is then placed between the organic layer 180 and the outside.

According to the present exemplary embodiment, when a common electrode 190 is formed on the organic layer 180 and the reflective film 172, the display device 1 is completed as shown in FIG. 2.

Figure 4:
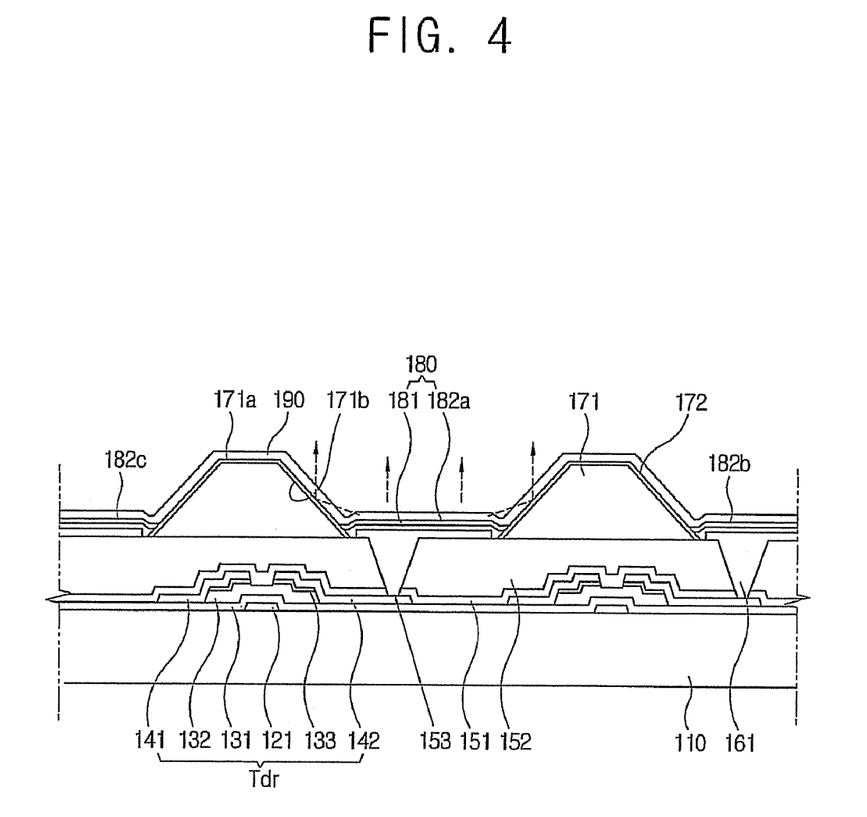
FIG. 4 is a cross-section diagram of a second exemplary embodiment of a display device according to the present invention.

FIG. 4 is a cross-section diagram of a second exemplary embodiment of a display device 1 according to the present invention. The below description will focus on the difference from the first embodiment.

In the second exemplary embodiment, the organic layer 180 is made of a polymer material and is formed by an ink jet method, but the present invention is not limited thereto. The organic layer 180 is partially in contact with a reflective film 172 due to a fluid nature of the ink jet formation method.

The hole injection layer 181, exemplary embodiments of which are made of hole injecting materials such as poly (3,4-ethylenedioxyt-hiophene) ("PEDOT") and polystyrene sulfonic acid ("PSS"), may be formed by the ink jet method. In the ink jet method, the hole injecting materials are held in a state of water phase suspension formed by mixing water with the hole injecting materials.

The light emitting layer 182 comprises polyfluorene derivatives, poly (p-phenylene vinylene) derivatives, polyphenylene derivatives, poly (n-vinylcarbazole) derivatives and poly thiophene derivatives or compounds thereof doped with a perillene group pigment, rhodamine, rubrene, perillene, 9,10-diphenylanthracene, tetraphenylbutadiene, nile red, cumarine 6, quiancridone, or other similar substances. The light emitting layer 182 comprises one of a plurality of sub layers 182a, 182b, 182c, each emitting a different color of light, or alternatively each of the sub layers 182a, 182b and 182c and a color filter as has been described above.

An exemplary embodiment of a method of manufacturing a display device according to the second exemplary embodiment of the present invention will be described below with reference to FIGS. 5A to 5C.

Figure 5A:
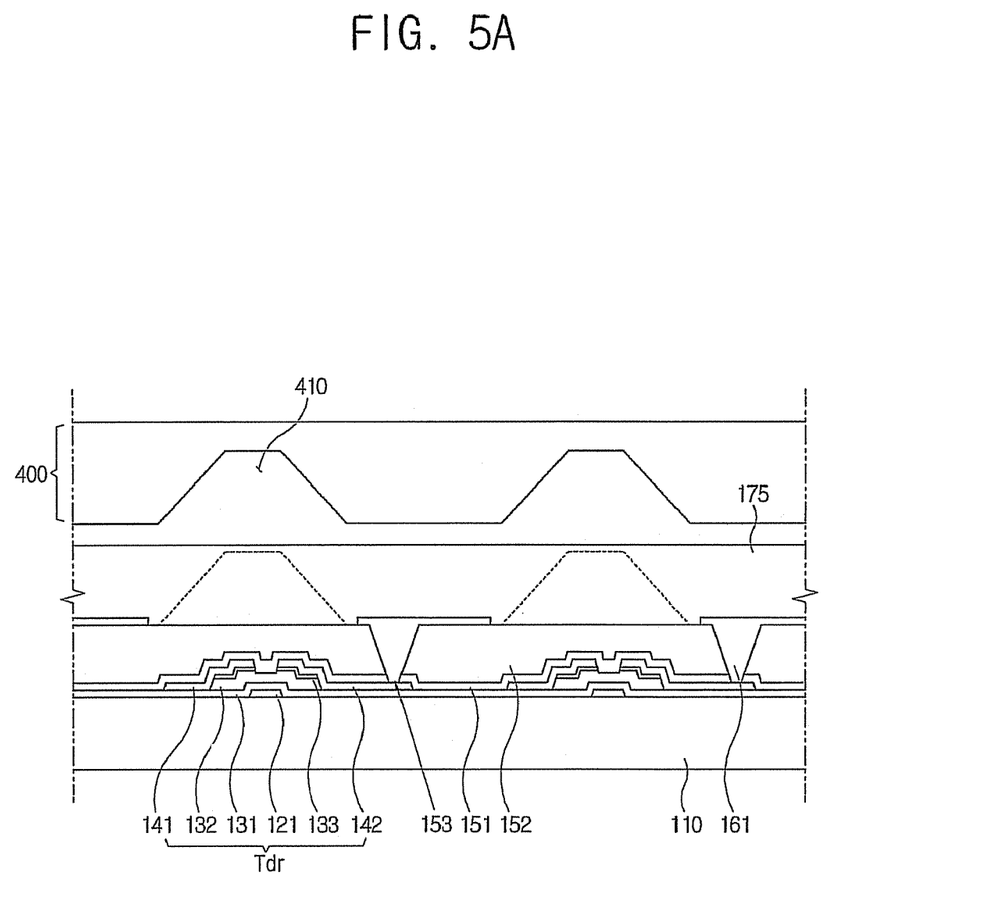
FIGS. 5a through 5c are cross-section diagrams illustrating an exemplary embodiment of a method of manufacturing the second exemplary embodiment of a display device according to the present invention.

FIG. 5a shows an exemplary embodiment of a method to form a wall 171 using an imprint mask 400 to deform a photosensitive material layer 175, which has already been disposed on the organic film 152 and pixel electrode 161. The operation of forming a photosensitive material layer 175 and the operations prior thereto are the same as those of FIGS. 3a and 3b, and thus repetition of their detailed description will be omitted.

An intaglio pattern 410 having a shape corresponding to the wall 171 is formed on the imprint mask 400. Pressing the imprint mask 400 against the photosensitive material layer 175, removing the mask, and baking the molded photosensitive material layer 175 forms a wall 171. This method has an advantage in that the wall 171 can be formed simply, since the exposing process, the developing process, etc are omitted.

Figure 5B:
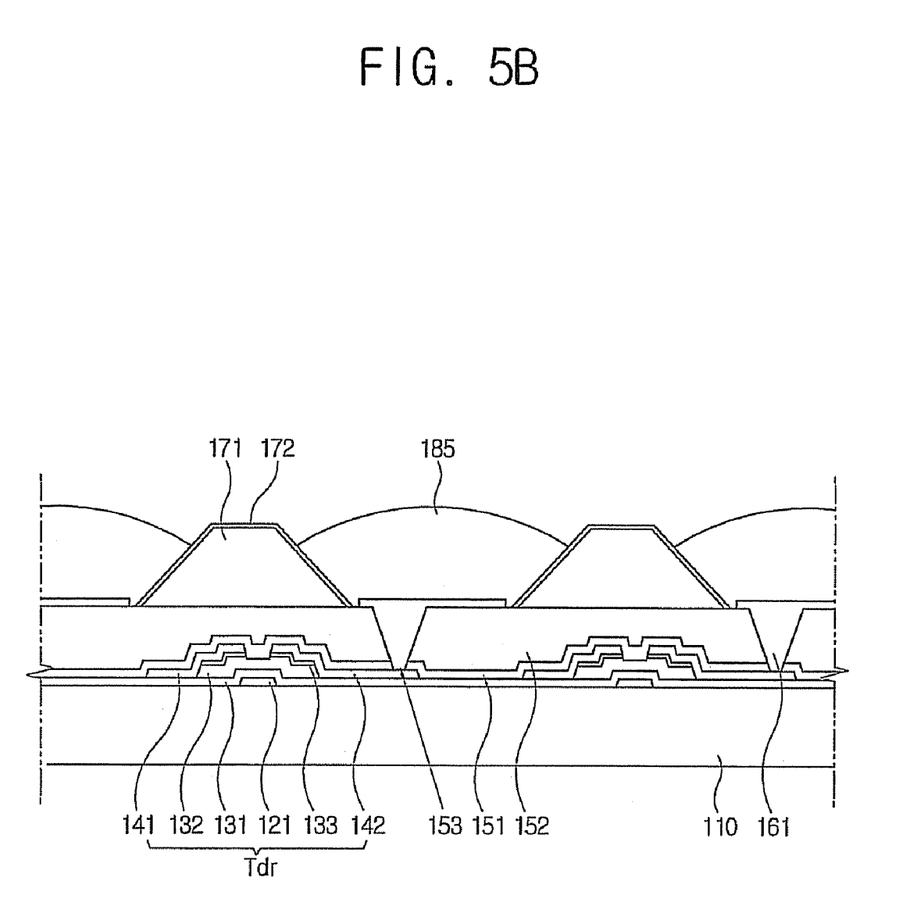

Next, the organic layer is formed by dropping and drying the hole injecting solution 185, a polymer material including a hole injecting material, between walls 171 on the pixel electrode 161 using an ink jet method as shown in FIG. 5b. The hole injecting solution 185 may include a compound of polythiophene derivatives such as poly (3,4-ethylenedioxythiophene) ("PEDOT"), polystyrene sulfonic acid ("PSS") and other similar substances, and a polar solvent in which the compound is dissolved. Exemplary embodiments of the polar solvent may comprise isopropyl alcohol ("IPA"), n-butanol, γ-butylolactone, N-methylpyrrolidone ("NMP"), 1,3-dimethyl-2-imidazolidinon ("DMI"), and its derivatives, and glycolether such as carbitolacetate, butylcarbitolacetate and the like.

Figure 5C:
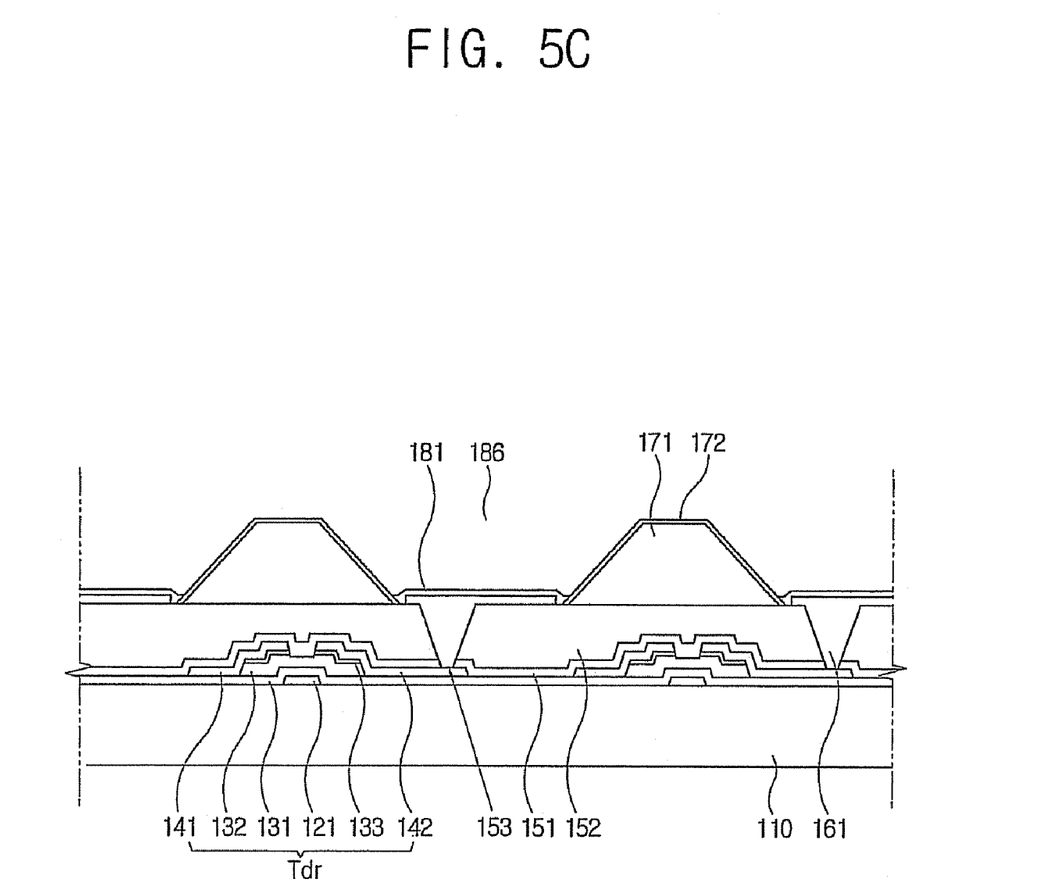

Then, the organic layer may be formed by dropping and drying the light emitting solution 186, a polymer material including a light emitting material, on the hole injection layer 181 using the ink jet method as shown in FIG. 5C.

The light emitting solution 186 is dried to form a light emitting layer 182. After that, a common electrode 190 is formed on the light emitting layer 182, and then the display device 1 is completed as shown in FIG. 3.

In the present exemplary embodiment the organic layers 181 and 182 are formed by the ink jet method as mentioned above. Thus, if the organic layers 181 and 182 are uniformly formed between the walls 171, they are partially in contact with the reflective film 172.

Figure 6:
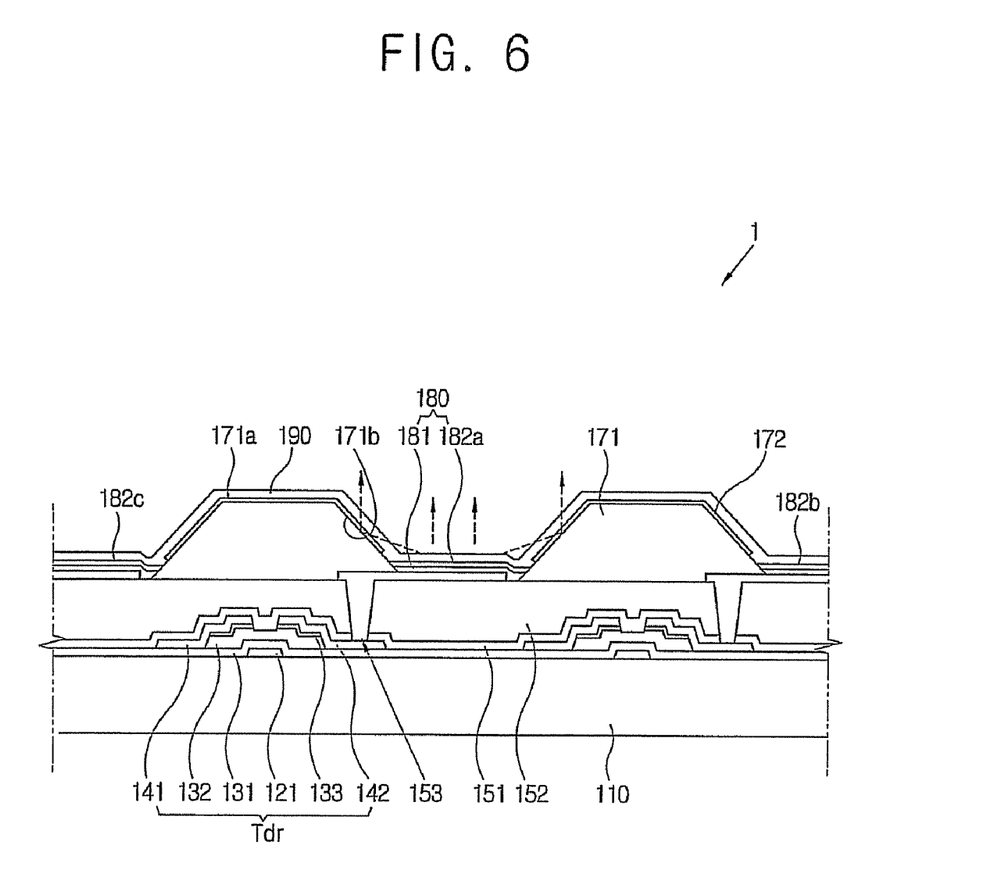
FIG. 6 is a cross-section diagram of a third exemplary embodiment of a display device according to the present invention.

FIG. 6 is a cross-section diagram of a display device 1 according to a third exemplary embodiment of the present invention. In the third exemplary embodiment, the organic layer 180 is made of a polymer material and is formed by ink jet method similarly to the second exemplary embodiment described above. The below description will focus on the differences from the second exemplary embodiment in order to avoid repetition.

In the present exemplary embodiment, the reflective film 172 is not formed on the wall 171 with which the organic layer 180 is in contact and also is not in contact with the pixel electrode 161. Thus, it is possible to prevent current from flowing from the common electrode. 190 through the reflective film 172 to the pixel electrode 161.

A wall 171 is formed to cover a contact hole 153. The pixel electrode 161 exposed between the walls 171 has a uniform thickness and therefore also has uniform electrical characteristics, thereby improving a display quality and preventing a thin film transistor Tdr from short-circuiting with a common electrode 190.

As mentioned above, the present invention may provide a display device with high optical efficiency.

In addition, the present invention may provide a manufacturing method of a display device with high optical efficiency.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display device comprising:
   a thin film transistor formed on an insulating substrate;
   a pixel electrode electrically connected to the thin film transistor;
   an organic layer formed on the pixel electrode;
   a wall surrounding the organic layer, at least part of the wall being made of a photosensitive organic material;
   a reflective film formed on the wall; and
   a common electrode formed on the organic layer,
   wherein the reflective film and the pixel electrode are spaced apart from each other, and wherein the reflective film is disposed between the pixel electrode and the common electrode.

2. The display device according to claim 1, wherein the reflective film comprises any one selected from a group consisting of Mo, Cr, Ag, and Al.

3. The display device according to claim 1, wherein the thickness of the reflective film is about 50 nm to about 500 nm.

4. The display device according to claim 1, wherein reflectivity of the reflective film is greater than about 70%.

5. The display device according to claim 1, wherein an angle between a side surface of the wall and the insulating substrate is about 40 degrees to about 50 degrees with respect to each other.

6. The display device according to claim 1, wherein the reflective film and the pixel electrode are spaced apart from each other.

7. The display device according to claim 1, wherein the reflective film and the organic layer are spaced apart from each other.

8. The display device according to claim 1, wherein the wall and the pixel electrode are spaced apart from each other.

9. The display device according to claim 1, wherein the wall and the organic layer are spaced apart from each other, and the organic layer comprises a low molecular weight material and is formed by an evaporation method.

10. The display device according to claim 1, wherein the wall and the organic layer are in contact with each other, the organic layer comprises polymer material and is formed by an ink jet method.

11. The display device according to claim 1, wherein the wall covers a part of the pixel electrode, and the reflective film is spaced from the pixel electrode.

12. The display device according to claim 1, wherein light transmittance of the common electrode is greater than 50%.

13. The display device according to claim 1, wherein an edge of the wall is spaced apart from an edge of the pixel electrode, the edge of the wall facing the edge of the pixel electrode.

14. A method of manufacturing a display device, comprising:
   forming a thin film transistor on an insulating substrate;
   forming a pixel electrode electrically connected to the thin film transistor;
   coating a photosensitive material on the pixel electrode;
   exposing and developing the photosensitive material to form a wall surrounding the pixel electrode;
   forming a reflective film on the wall;
   forming an organic layer on the pixel electrode; and
   forming a common electrode on the organic layer,
   wherein the reflective film and the pixel electrode are spaced apart from each other, and wherein the reflective film is disposed between the pixel electrode and the common electrode.

15. The manufacturing method according to claim 14, wherein the wall is formed with a side surface thereof and the insulating substrate making an angle of about 40 degrees to about 50 degrees with respect to each other.

16. The manufacturing method according to claim 14, wherein the photosensitive material is positive type.

17. The manufacturing method according to claim 14, wherein the photosensitive material is negative type.

18. The manufacturing method according to claim 14, wherein the exposing the photosensitive material is performed by using a mask having a slit pattern formed to correspond to a side surface of the wall.

19. The manufacturing method according to claim 14, wherein the forming of the organic layer comprises:
   arranging a shadow mask having an opening wider than a region surrounded by the wall where the opening corresponds to the pixel electrode; and
   supplying organic material vapor through the opening.

20. The display device according to claim 14, wherein an edge of the wall is spaced apart from an edge of the pixel electrode, the edge of the wall facing the edge of the pixel electrode.

21. A method of manufacturing a display device, comprising:
   forming a thin film transistor on an insulating substrate;
   forming a pixel electrode electrically connected to the thin film transistor;
   coating a photosensitive material on the pixel electrode;
   pressing an imprint mask formed with an intaglio pattern against the photosensitive material to form a wall surrounding the pixel electrode;
   forming a reflective film on the wall;
   forming an organic layer on the pixel electrode; and
   forming a common electrode on the organic layer,
   wherein the reflective film and the pixel electrode are spaced apart from each other, and wherein the reflective film is disposed between the pixel electrode and the common electrode.

22. The display device according to claim 21, wherein an edge of the wall is spaced apart from an edge of the pixel electrode, the edge of the wall facing the edge of the pixel electrode.

* * * * *